United States Patent
Kwong

[19]

[11] Patent Number: 6,034,553
[45] Date of Patent: Mar. 7, 2000

[54] BUS SWITCH HAVING BOTH P- AND N-CHANNEL TRANSISTORS FOR CONSTANT IMPEDANCE USING ISOLATION CIRCUIT FOR LIVE-INSERTION WHEN POWERED DOWN

[75] Inventor: David Kwong, Fremont, Calif.

[73] Assignee: Pericom Semiconductor Corp., San Jose, Calif.

[21] Appl. No.: 09/004,929

[22] Filed: Jan. 9, 1998

[51] Int. Cl.[7] .............................................. H03K 19/0175
[52] U.S. Cl. ............................. 326/86; 326/113; 326/57; 326/58
[58] Field of Search ................................. 326/27, 57, 58, 326/80, 81, 83, 86, 113; 327/534

[56] References Cited

U.S. PATENT DOCUMENTS

| | | | |
|---|---|---|---|
| 5,166,957 | 11/1992 | Lenoir ........................................ | 375/36 |
| 5,220,211 | 6/1993 | Christopher et al. .................... | 307/443 |
| 5,430,396 | 7/1995 | Morano ..................................... | 326/90 |
| 5,444,397 | 8/1995 | Wong et al. .............................. | 326/81 |
| 5,455,732 | 10/1995 | Davis ....................................... | 361/90 |
| 5,467,031 | 11/1995 | Ngyuyen et al. ......................... | 326/81 |
| 5,528,190 | 6/1996 | Honnigford ............................. | 327/328 |
| 5,546,017 | 8/1996 | Vitunic ...................................... | 326/30 |
| 5,550,699 | 8/1996 | Diaz ........................................... | 361/56 |
| 5,583,998 | 12/1996 | Bowman .................................... | 395/280 |

*Primary Examiner*—Michael Tokar
*Assistant Examiner*—Anh Q Tran
*Attorney, Agent, or Firm*—Stuart T. Auvinen

[57] ABSTRACT

A bus switch uses both n-channel and p-channel transistors in parallel to connect two busses. The bus switch can be used on a network card to be plugged into a running network. During hot or live insertion of the network card into a live or hot bus, the network card and a bus switch are in a powered down state. Although n-channel transistors are normally off when the power is off, p-channel transistors can conduct. The hot bus could be disturbed when the bus switch is first connected since the p-channel transistor conducts when its gate is powered down to zero volts. A p-n junction from the p-channel transistor's drain to its substrate can become forward biased, drawing current from the hot bus. These problems are avoided by an isolation circuit that operates without power from a power supply. Instead, a high voltage from the hot bus is routed to the gate of the p-channel transistor, keeping the p-channel transistor turned off during hot insertion. The high voltage frog the hot bus is also routed to the substrate or N-well under the p-channel transistor, preventing the p-n junction from forward biasing. Thus a full CMOS bus switch can be used for live insertion, even when powered down.

19 Claims, 7 Drawing Sheets

FIG. 1
PRIOR ART
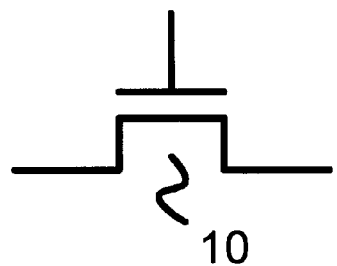
3v → 2v
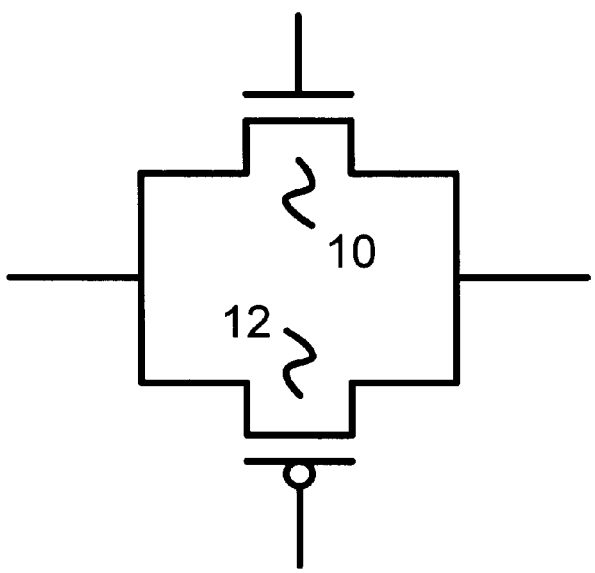
FIG. 2
PRIOR ART
3v → 3v
FIG. 3
PRIOR ART
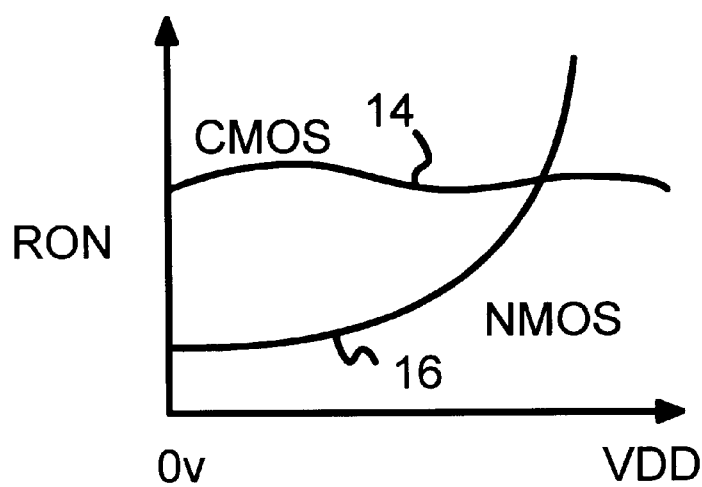

6,034,553

BUS SWITCH HAVING BOTH P- AND N-CHANNEL TRANSISTORS FOR CONSTANT IMPEDANCE USING ISOLATION CIRCUIT FOR LIVE-INSERTION WHEN POWERED DOWN

FIELD OF THE INVENTION

This invention relates to CMOS bus switches, and more particularly to control circuits for CMOS bus switches for live insertion when the bus switch is powered down.

BACKGROUND OF THE INVENTION

Commonplace today are high-speed communication systems that connect computer users together. Networks allow users to share data and work cooperatively. At a physical level, these networks have cables that connect together user's stations, and these cables are in turn connected together using relays or switches. Traditional electro-mechanical relays are being replaced by solid-state relays and bus switches.

Bus switches are semiconductor integrated circuits (IC's) that use metal-oxide semiconductor (MOS) transistors to make or break the connection. Several switches may be combined on a single silicon die. One such device is made by the assignee and marketed as the P15C3861 Bus Switch. More background on bus switches can be found in "Parallel Micro-Relay Bus Switch for Computer Network Communication with Reduced Crosstalk and Low On-Resistance using Charge Pumps", assigned to Pericom Semiconductor and Hewlett-Packard Company, U.S. Pat. No. 5,808,502, U.S. Ser. No. 08/622,703.

FIG. 1 shows a prior-art bus switch device. N-channel transistor 10 conducts current from its drain to its source, connecting signal lines from two buses when an enable signal is applied to the gate of n-channel transistor 10. Bus switches are usually large in size to allow a large amount of current to flow, and to provide a low on resistance.

While such an NMOS bus switch is effective for 5-volt systems, newer 3-volt systems have lower noise margins. When the gate of n-channel transistor 10 is driven to the 3-volt power supply, a voltage drop of a threshold voltage occurs across the channel. Thus a 3-volt signal applied to the drain of transistor 10 is degraded to a 2-volt signal at its source. Other devices on the bus may require TTL input-voltages. These TTL devices require a high voltage of at least 2.0 volts, leaving no noise margin for voltage drops across the bus.

Future reductions in supply voltage will make the use of simple NMOS bus switches impossible. One solution is to use a charge pump or DC-DC converter to generate a boosted voltage above the 3-volt supply, and to apply this boosted voltage to the gate of the NMOS bus switch. See for example "Voltage Booster with Pulsed Initial Charging and Delayed Capacitive Boost Using Charge-Pumped Delay Line", assigned to Pericom Semiconductor, U.S. Ser. No. 08/990,894 filed Dec. 15, 1997, Docket No. PS-20. Such DC-DC converters draw current and may not be able to meet speed requirements.

A p-channel transistors can be connected in parallel to the n-channel transistor to form a complementary metal-oxide-semiconductor (CMOS) bus switch. FIG. 2 shows p-channel transistor 12 connected in parallel with n-channel transistor 10 to form a CMOS bus switch. An enable signal is applied to the gate of n-channel transistor 10. An inverter generates the inverse of the enable signal, which is applied to the gate of p-channel transistor 12. Thus both transistors 10, 12 are enabled or disabled at the same time.

A CMOS bus switch does not develop a voltage drop across the source and drain terminals, even when reduced power supplies are used. For high signals when n-channel transistor 10 becomes saturated, p-channel transistor 12 is still in the linear region of operation and thus passes a full 3-volt signal across its channel without the threshold-voltage drop experienced by an n-channel transistor.

FIG. 3 shows the on-resistance across NMOS and CMOS bus switches. On-resistance 16 from source to drain through the transistor's channel varies with the drain voltage for the NMOS bus switch. On-resistance 16 rises sharply as the saturation voltage is reached. In contrast, on-resistance 14 for the CMOS bus switch is relatively constant for all drain voltages, since the p-channel transistor becomes more conductive to compensate for the n-channel transistor becoming less conductive as the drain voltage is increased.

Live Insertion—FIG. 4

Modern networking equipment is often reconfigured. It is desirable to add network boards or cards to a backplane bus without powering down the bus and thus shutting down the network. This is known as hot insertion or live insertion. FIGS. 4A–4C illustrate live insertion.

In FIG. 4A, hot bus 20 is a network bus such as a backplane bus in a chassis or equipment rack. Hot bus 20 is powered up and active, having signals in high and low states. These signals may be changing rapidly during the insertion sequence.

A network card is to be inserted into a slot in the chassis, and a connector on the card is to be plugged into a connector on the chassis connected to hot bus 20. The network card includes interface circuitry 22 and bus switch 18. Since no power has yet been applied to the network card, both interface circuitry 22 and bus switch 18 are powered down, with their power supply VDD floating or grounded at 0 volts.

In FIG. 4B, the network card has been inserted into the chassis, and the connectors plugged together. Bus switch 18 is electrically connected to hot bus 20. Bus switch 18 must electrically isolate hot bus 20 from interface circuitry 22, even though power has not yet been applied to interface circuitry 22 or even to bus switch 18.

In FIG. 4C, the inserted network card is powered up. The card's internal power supply VDD reaches 3 volts in a few milliseconds after plugging the card into the connector. However, during these few milliseconds, hot bus 20 must be isolated from interface circuitry 22 by bus switch 18; otherwise the signals on hot bus 20 can be disturbed. Data on hot bus 20 can be lost since high data rates use only a few microseconds or nanoseconds for each data transfer.

Once powered up, interface circuitry 22 can connect to hot bus 20 by enabling bus switch 18. An enable signal is generated by control logic in interface circuitry 22 or other logic on the inserted network card.

NMOS bus switches are ideal for live-insertion applications, since n-channel transistors do not conduct when their gates are grounded. The drains of n-channel transistors can be directly connected to the hot bus since the p-type substrates are also grounded, preventing the forward-biasing of any p-n junctions.

PMOS Bus Switch Latches Up During Live Insertion—FIG. 5

CMOS bus switches pose several problems for live insertion since p-channel transistors conduct current when their gates are grounded. FIG. 5 shows how a p-channel transistor in a CMOS bus switch can latch up during live insertion. During live insertion, as shown in FIG. 4B, the hot bus has some high signals while the interface circuitry and the bus switch are powered down. Most or all signals in powered-down circuitry is at zero volts, even when floating.

Thus the hot-bus side of the CMOS bus switch can be high, at 3 volts, while the other side is powered-down at ground. While n-channel transistor 10 does not conduct since its gate is also at ground, p-channel transistor 12 can conduct current from hot bus 20 when its gate is at ground. Even as the bus switch is powered up, p-channel transistor 12 can continue conducting current from the hot bus until its gate reaches 2 or 3 volts.

An even more serious problem is that the drain of p-channel transistor 12 can initiate latch up. The p+ drain is connected to the hot bus, which may be high at 3 volts. The N-well under p-channel transistor 12 is grounded when powered down. The P+ drain to-N-well diffusions form a p-n diode that is forward biased. Since the N-well is rather large with many capacitances, it may be slow to power up to 3 volts. Thus latch up can occur during power up of CMOS bus switches. Even if latch up is not fully developed during power up, the forward biased p-n junction can discharge the hot bus. Additionally, when power is disconnected, these diodes pull the bus to one diode drop above ground, interfering with the normal operation of the hot bus.

The hot bus can be disturbed, causing data loss, when current is connected through p-channel transistor 12, or through the forward-biased p-n junction. Thus CMOS bus switches are difficult to use in live insertion applications.

What is desired is to use a CMOS bus switch for live insertion applications. It is desired to use a CMOS bus switch that is powered down for insertion into a hot, live bus without disturbing the hot bus. A self-isolating CMOS bus switch that isolates even without power being applied is desired.

SUMMARY OF THE INVENTION

A bus switch for live insertion has a hot bus for actively transferring data by pulsing high and low. The bus switch connects the hot bus to a second bus that is powered down. An n-channel bus-switch transistor is coupled to connect the hot bus to the second bus in response to an enable signal. A p-channel bus-switch transistor is coupled to connect the hot bus to the second bus in response to a gate node. The gate node is driven by an inverse signal of the enable signal when the bus switch is powered up.

A gate-isolation circuit for the p-channel bus-switch transistor has a first pair of p-channel connecting transistors that are connected together in series between the hot bus and the gate node. One gate is connected to power and another gate is connected to the second bus. It connects the hot bus to the gate node when power is off and the second bus is low.

A core-isolation n-channel transistor has a gate connected to power. It connects the inverse signal to the gate node when powered. A core-isolation p-channel transistor has a gate connected to a control node. It connects the inverse signal to the gate node when powered. A pull-down n-channel transistor has a gate connected to power. It pulls the control node low when powered to enable the core-isolation p-channel transistor. A pull-up p-channel transistor has a gate connected to power. It connects the control node to the gate node when not powered to disable the core-isolation p-channel transistor.

A well-isolation circuit has a tap to an N-well that the p-channel bus-switch transistor is formed in. A bus isolation p-channel transistor has a gate connected to power and a source connected to the hot bus and a first drain. A sensing p-channel transistor has a gate connected to the second bus. It conducts from the first drain to a second node.

A well-isolation p-channel transistor has a gate connected to power. It conducts between the second node and the tap to the N-well. A supply p-channel transistor has a supply gate and a source connected to power; it connects power to the tap to the N-well when powered.

A disable p-channel transistor has a gate connected to power; it connects the second node to the supply gate when not powered. A disable pull-down n-channel transistor has a gate connected to power. It pulls the supply gate low when powered.

Thus the hot bus is connected to the gate node and to the N-well when the bus switch is not powered.

In further aspects the well-isolation circuit further has a second bus-isolation p-channel transistor that has a gate connected to power and a source connected to the second bus and a third drain. A second sensing p-channel transistor has a gate connected to the hot bus. It conducts from the third drain to a fourth node.

A second well-isolation p-channel transistor has a gate connected to power. It conducts between the fourth node and the tap to the N-well. A second supply p-channel transistor has a second supply gate and a source connected to power; it connects power to the tap to the N-well when powered. A second disable p-channel transistor has a gate connected to power. It connects the fourth node to the second supply gate when not powered. A second disable pull-down n-channel transistor has a gate connected to power to pull the second supply gate low when powered. This allows the bus switch to be live-inserted into either the hot bus or the second bus.

In still further aspects the gate-isolation circuit also has a second pair of p-channel connecting transistors connected together in series between the second bus and the gate node. One gate is connected to power and another gate is connected to the hot bus. It connects the second bus to the gate node when power is off and the hot bus is low. Thus a high voltage on either the second bus or the hot bus is connected to the gate node when powered off.

In other aspects all p-channel transistors in the gate-isolation circuit and all p-channel transistors in the well-isolation circuit are electrically connected to the tap to the N-well driven by the well-isolation circuit and not directly connected to power.

In other aspects the second bus is an internal bus on a network-interface card that is powered down during live insertion into the hot bus. The bus switch is on the network-interface card.

BRIEF DESCRIPTION OF THE DRAWINGS

FIG. 1 shows a prior-art bus switch device.

FIG. 2 shows a p-channel transistor connected in parallel with n-channel transistor 10 for form a CMOS bus switch.

FIG. 3 shows the on-resistance across NMOS and CMOS bus switches.

DETAILED DESCRIPTION

The present invention relates to an improvement in CMOS bus switches. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Highest Available Voltage Routed to Gate, N-Well

The inventor has realized that a full-CMOS bus switch is ideally suited for live-insertion if the problems of the p-channel transistor leakage can be solved. The p-channel transistor in the bus switch can provide high impedance if its gate and substrate voltages are carefully controlled when powered-down.

The gate of the p-channel transistor must be driven with the highest available voltage to shut off the p-channel transistor. Likewise, the N-well under the p-channel transistor must also be driven with the highest available voltage. The highest available voltage is not the internal power supply when the device is powered down; instead, the source or drain of the bus switch connected to the hot bus is likely to be the highest voltage.

N-well technology is used for the bus switch rather than P-well technology. This allows the N-well under the p-channel transistor to be isolated from other p-channel transistors on the chip. Rather than simply connect the N-well to the power supply, the N-well is driven by a substrate isolation circuit.

Figure 4A:
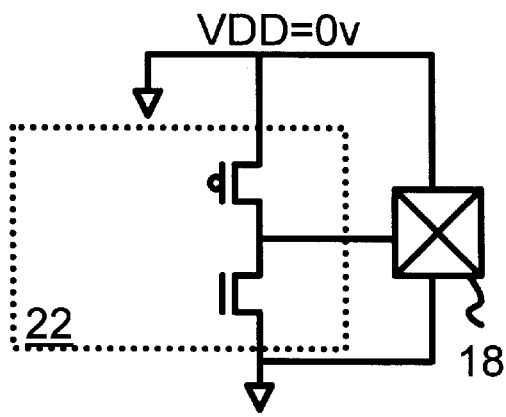
FIGS. 4A–4C illustrate live insertion.
Figure 4B:
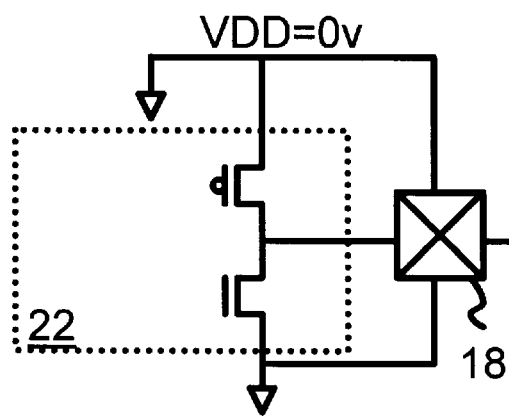
Figure 4C:
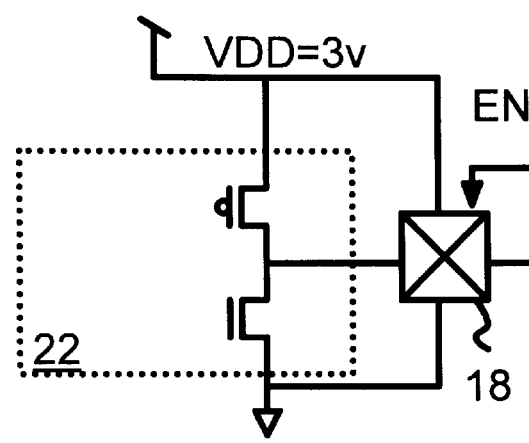
Figure 5:
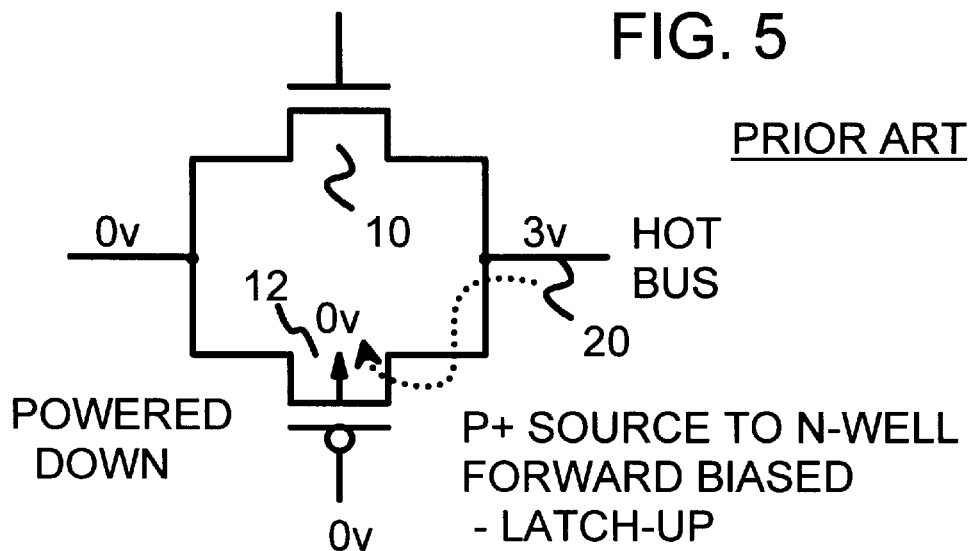
FIG. 5 shows how a p-channel transistor in a CMOS bus switch can latch up during live insertion.
Figure 6:
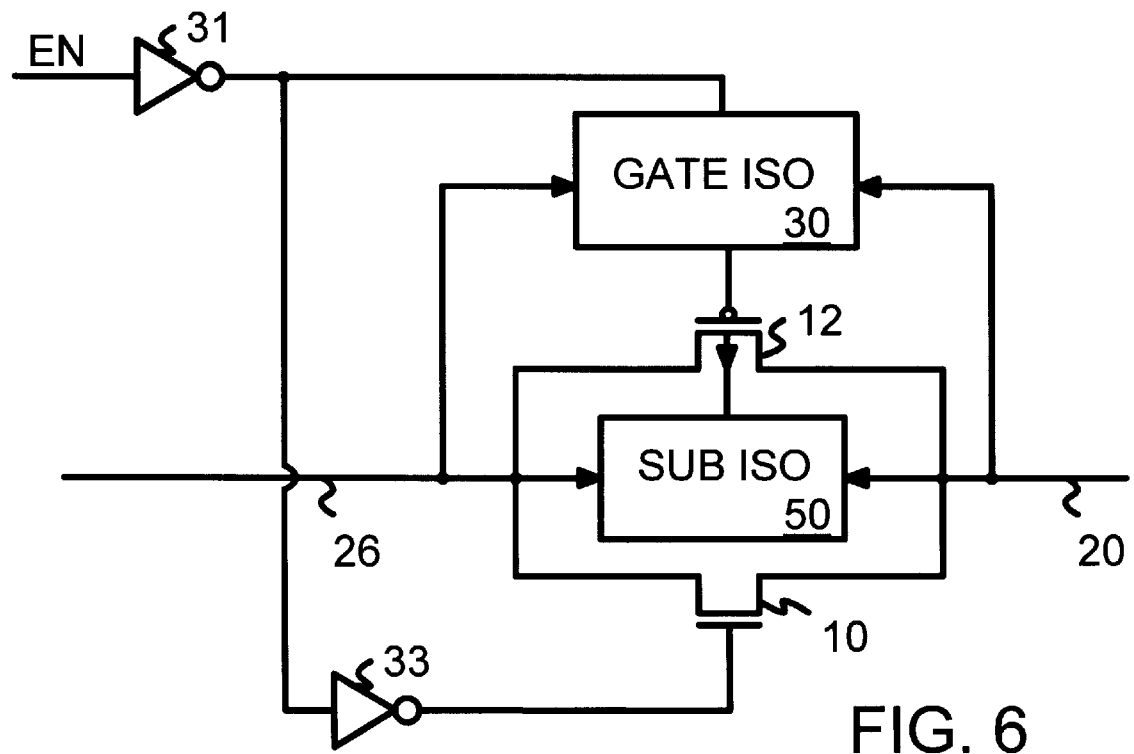
FIG. 6 is a diagram of a CMOS bus switch that has high impedance when powered down.

Powered-Down CMOS Bus Switch—FIG. 6

FIG. 6 is a diagram of a CMOS bus switch that has high impedance when powered down. The bus switch has n-channel transistor 10 and p-channel transistor 12 in parallel between hot bus 20 and a second bus 26 that may or may not be powered up. Enable signal ENABLE is buffered by inverters 31, 33 and applied to the gate of n-channel transistor 10. The inverse of enable from inverter 31 is also applied to the gate of p-channel transistor 12 through gate isolation circuit 30 when the device is powered up.

When power is off, enable signal ENABLE is floating, and the gate of n-channel transistor 10 is also floating. Since charge leaks off after a period of time, it is likely that the gate of n-channel transistor 10 is at ground when powered off. Thus n-channel transistor 10 does not conduct current from hot bus 20 to second bus 26 when powered off, regardless of the voltages on hot bus 20 and second bus 26.

P-channel transistor 12 would otherwise conduct current from hot bus 20 to second bus 26 when powered down. Anytime that a high voltage is on hot bus 20, a negative gate-to-source voltage develops on p-channel transistor 12 if its gate were grounded. Instead, gate isolation circuit 30 samples the voltages from hot bus 20 and second bus 26, and applies the highest voltage to the gate of p-channel transistor 12. When hot bus 20 is at a high voltage, this same high voltage is applied to the gate of p-channel transistor 12 by gate isolation circuit 30. Thus p-channel transistor 12 is shut off, presenting a high impedance to hot bus 20.

The substrate or N-well under p-channel transistor 12 must also be driven with the highest available voltage. Substrate isolation circuit 50 samples the voltages on hot bus 20 and second bus 26 and applies the highest voltage to the N-well under p-channel transistor 12. This puts the substrate and the p+drain at the same voltage, preventing the p-n junction from being forward biased.

Isolation Circuits Operate Without Power

When the bus switch is powered up, substrate isolation circuit 50 applies $V_{DD}$ from the internal power supply to the N-well, while gate isolation circuit 30 applies the inverse enable from inverter 31 to the gate of p-channel transistor 12. What is remarkable is that both gate isolation circuit 30 and substrate isolation circuit 50 operate without power, even when the internal power supply is grounded or floating.

Figure 7:
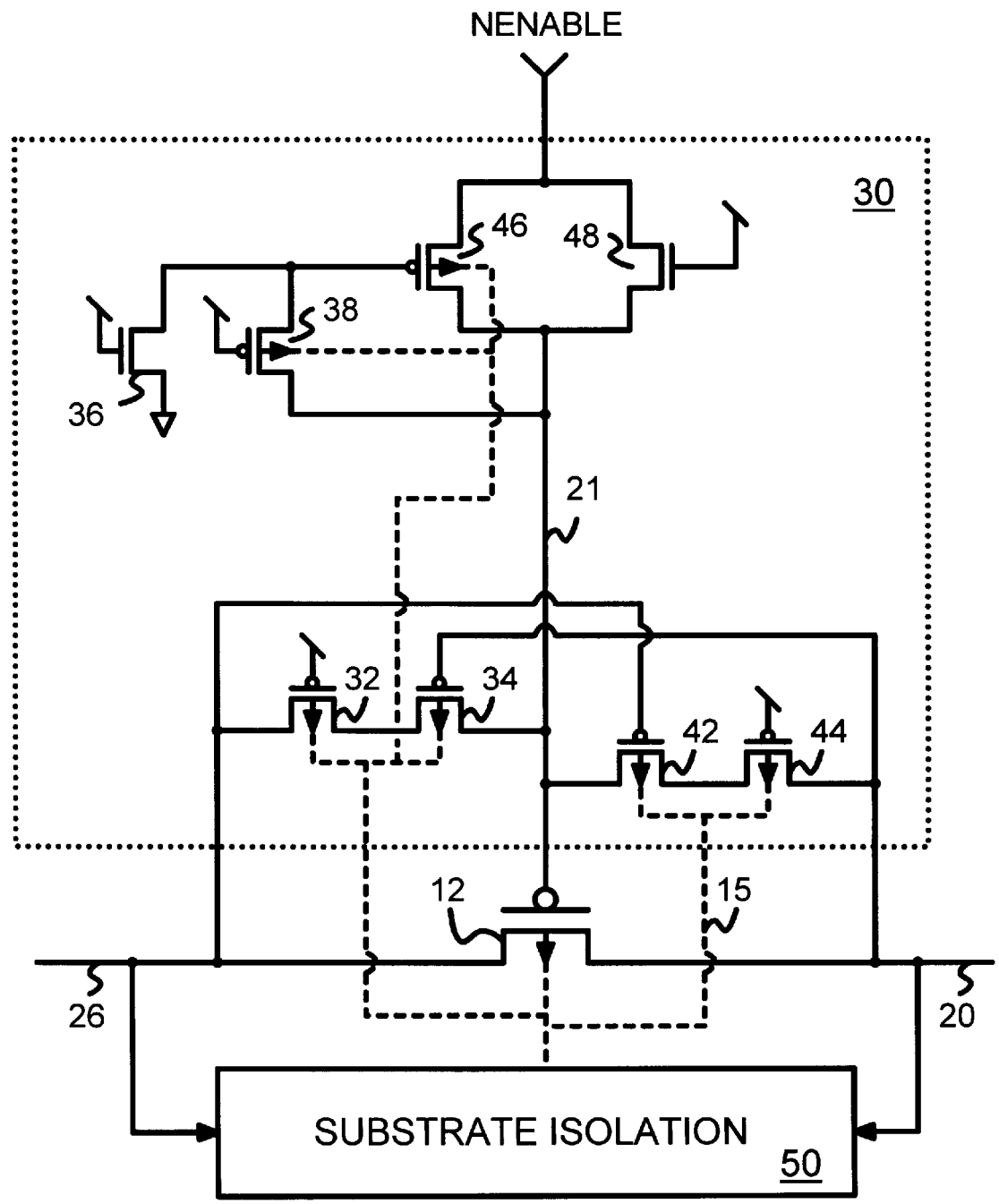
FIG. 7 is a detailed schematic of a gate isolation circuit that operates without power to apply a high voltage to the PMOS gate to put the bus switch into a high impedance state during power down.

Gate Isolation Circuit—FIG. 7

FIG. 7 is a detailed schematic of a gate isolation circuit that operates without power to apply a high voltage to the PMOS gate to put the bus switch into a high impedance state during power down. P-channel transistor 12 connects hot bus 20 to second bus 26 when power is applied and NENABLE is low. The n-channel transistor in parallel with p-channel transistor 12 (not shown) also conducts when NENABLE is low. The size (W/L) of the p-channel transistor is typically 2.7 times the size (W/L) of the n-channel transistor to account for the lower hole mobility.

Substrate isolation circuit 50 samples the voltages of both hot bus 20 and second bus 26 and drives the highest voltage onto the N-well under p-channel transistor 12. This N-Well is a node shared with the substrate terminals of other p-channel transistors in gate isolation circuit 30. N-well node 15 is shown by dashed lines in FIGS. 7 and 8. Substrate isolation circuit 50 is shown in detail later in FIG. 8.

When the bus switch is powered down, all $V_{DD}$ connections are essentially grounded. N-channel transistors 48, 36 do not conduct since their gates are connected to $V_{DD}$, which is ground at power-down. However, p-channel transistors 38, 32, 44 all conduct, since their gates are connected to $V_{DD}$, which is low at power down. These transistors behave in the opposite manner once power is applied: the n-channel transistors conduct while the p-channel transistors do not conduct.

Gate node 21 is the gate of bus switch p-channel transistor 12. Gate node 21 is driven by NENABLE through core-isolation transistors 46, 48 when power is on, but core-isolation transistors 46, 48 isolate gate node 21 when power is off. Core-isolation transistors 46, 48 form a transmission gate that is on when power is on, but off when power is off. Core-isolation p-channel transistor 46 has its gate pulled low when power is on by n-channel pull-down transistor 36, which has its gate tied to $V_{DD}$. When power is off, n-channel pull-down transistor 36 is off, but p-channel transistor 38 is on, connecting the gate of p-channel transistor 46 to gate node 21.

During power-down, gate node 21 is connected to the highest available voltage, either by connecting transistors 42, 44 to hot bus 20, or by connecting transistors 32, 34 to second bus 26. This highest voltage on gate node 21 is conducted through p-channel transistor 38 to the gate of core-isolation p-channel transistor 46, thus shutting it off. Thus both core-isolation transistors 46, 48 are off, isolating the inverse-enable signal NENABLE from the bus switch.

When power is off, p-channel connecting transistors 32, 44 conduct since their gates are connected to the grounded $V_{DD}$. Hot bus 20 controls the gate of p-channel connecting transistor 34, while second bus 26 controls the gate of p-channel connecting transistor 42. Gate node 21 is connected to hot bus 20 through p-channel connecting transistors 42, 44 when second bus 26 is low, which it normally is when power is off. If for some reason second bus 26 is at a high voltage while hot bus 20 is at a low voltage, then connecting transistors 32, 34 connect the higher voltage on second bus 26 to gate node 21. Either way, gate node 21 is connected to the high voltage on either hot bus 20 or second bus 26.

If both hot bus 20 and second bus 26 are in the same state, high or low, then the bus switch can open without disturbing the data on the hot bus. When both busses are low, then both sides are connected to gate node 21. When both sides are high, then gate node 21 is isolated from both busses. Isolation is not necessary in these same-state cases.

As power is gradually ramped up, the internal power supply $V_{DD}$ rises from ground to 3 volts. Core-isolation transistors 46, 48 begin to conduct, driving a high voltage of NENABLE to gate node 21. The driver for NENABLE can be designed to quickly drive a high voltage on power up, such as by limiting the capacitance of the NENABLE line. Connecting transistors 32, 44 stop conducting, disconnecting gate node 21 from hot bus 20 or second bus 26. To prevent accidental discharge of gate node 21, $V_{cc}$ to the gate of n-channel core-isolation transistor 48 can be delayed on power up, such as being driven by an inverter with its input grounded.

Figure 8:
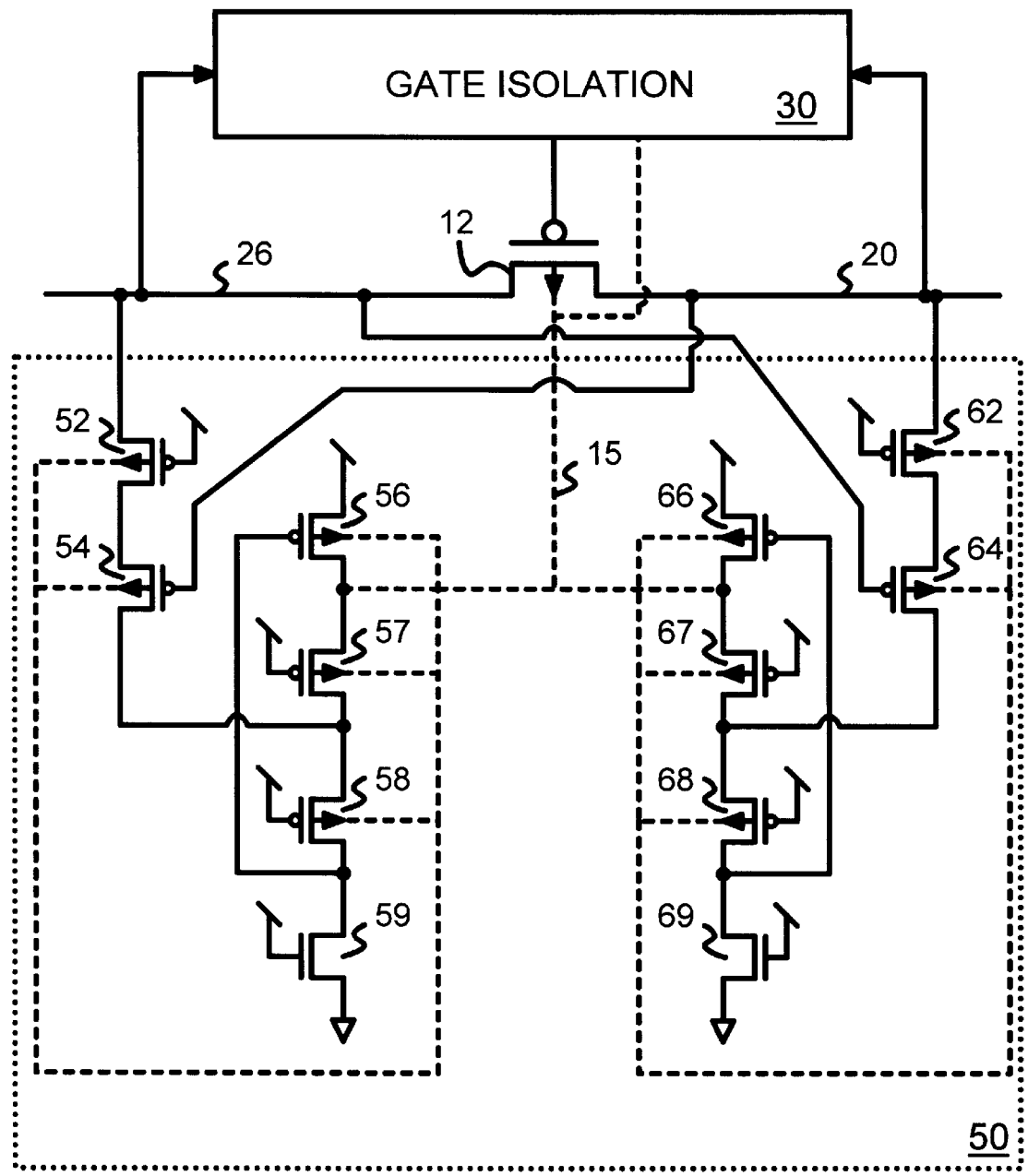
FIG. 8 is a diagram of a substrate isolation circuit that operates when the power supply is powered down to connect the highest available voltage to the N-well substrate.

Substrate Isolation Circuit—FIG. 8

FIG. 8 is a diagram of a substrate isolation circuit that operates when the power supply is powered down to connect the highest available voltage to the N-well substrate. Gate isolation circuit 30 was shown in FIG. 7, and its p-channel transistors share a common N-well node 15 with p-channel bus switch transistor 12, and the p-channel transistors in substrate isolation circuit 50. These N-wells can be one continuous N-well, or many N-wells that are electrically connected together through well taps and metal lines. However, these N-wells do not have direct taps to the power supply $V_{DD}$. Thus N-well node 15 is isolated from the power supply.

When $V_{DD}$ is powered up, n-channel transistors 59, 69 conduct while p-channel transistors 52, 62, 57, 67, 58, 68 shut off because their gates are connected to $V_{DD}$. The opposite is true when $V_{DD}$ is powered down to zero volts: n-channel transistors 59, 69 shut off while p-channel transistors 52, 62, 57, 67, 58, 68 conduct. N-well node 15 is driven to $V_{DD}$ by transistors 56, 66 when power is on, but N-well node 15 is driven to the highest bus voltage when power is off. For example, when hot bus 20 is high and second bus 26 is low (powered down), N-well 15 is connected to the high voltage from hot bus 15 through transistors 62, 64, 67.

Bus isolation transistors 52, 62 are p-channel transistors with their gates connected to the internal power supply $V_{DD}$. When $V_{DD}$ is powered down, isolation transistors 52, 62 are turned on, allowing the voltages on second bus 26 and hot bus 20 to be routed to N-well node 15. Sensing transistors 54, 64 are p-channel transistors that have their gates cross-coupled to hot bus 20 and second bus 26, respectively. When one of the busses is low, one of sensing transistors 54, 64 is activated to conduct the high voltage from the other bus. For example, when hot bus 20 is high but second bus 26 is low, such as when powered down for hot insertion, then the high voltage from hot bus 20 is conducted through bus isolation transistor 62 and sensing transistor 64. Sensing transistor 54 is shut off, isolating second bus 26.

Well isolation transistors 57, 67 are p-channel transistors with gates connected to the powered-down $V_{DD}$, and so conduct. The sources of well isolation transistors 57, 67 are connected to N-well node 15. Thus the high voltage from hot bus 20 is conducted through transistors 62, 64 and then through well isolation transistor 67 to drive the N-well with the high voltage.

When power is restored, N-well node 15 is connected to the power supply $V_{DD}$ through supply transistors 56, 66. Supply transistors 56, 66 are p-channel transistors with their sources connected to the internal power supply $V_{DD}$, and their drains connected to N-well node 15. Their gates are driven low by pull-down transistors 59, 69 with gates connected to $V_{DD}$, which conduct when $V_{DD}$ is powered up.

During power-down, the gates of supply transistors 56, 66 are driven high by disable transistors 58, 68. Disable transistors 58, 68 are p-channel transistors with their gates connected to $V_{DD}$. They connect the high voltage from sensing transistors 54, 64 to the gates of supply transistors 56, 66 when $V_{DD}$ is grounded, but otherwise turn off.

Figure 9:
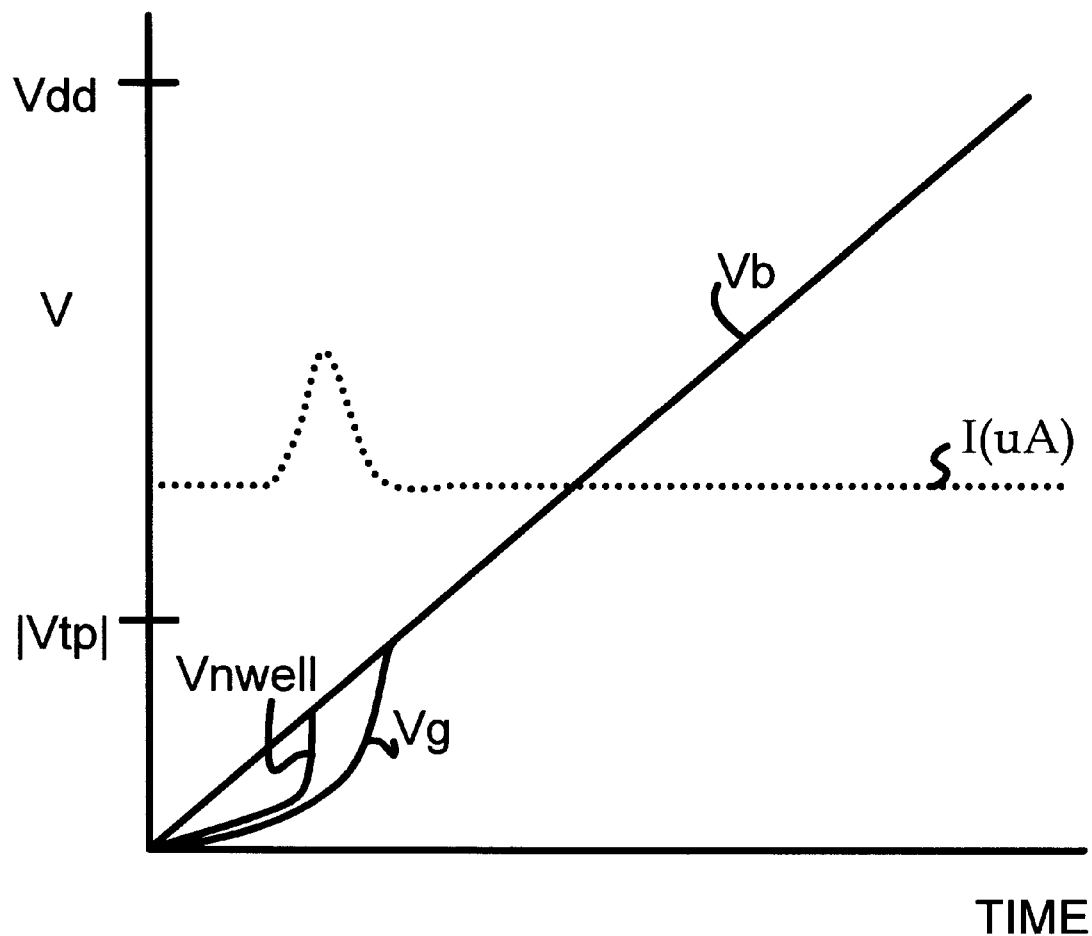
FIG. 9 is a diagram of the voltage and current characteristics during live insertion for the isolation circuit of FIGS. 7, 8.

Voltage Characteristics—FIG. 9

FIG. 9 is a diagram of the voltage and current characteristics during live insertion for the isolation circuit of FIGS. 7, 8. The bus switch and second bus are powered down when the network card is inserted into the hot bus. The enable signals to both the n-channel and p-channel bus switch transistors are both lows, even though they are logical inverses. This occurs because inverters driving ENABLE and NENABLE have no power and can only output zero volts.

When the hot bus is high, such as at $V_{DD}$, the bus charges the internal capacitances of the hot-bus side of the bus switch in the fraction of a second after physical contact is made as the network card is being plugged in. Thus the internal voltage $V_B$ of the hot bus at the bus switch slews up from ground to $V_{DD}$ as shown.

The gate voltage $V_G$ of the p-channel bus switch transistor, and the N-well voltage $V_{N-WELL}$, initially lag $V_B$ until $V_B$ reaches the threshold voltage for p-channel transistors, $|V_{TP}|$. Once the threshold is reached, the gate voltage and the N-well voltage track the hot bus voltage $V_B$.

Leakage current from the hot bus through the bus switch is low, less than 10 microamps. The leakage current has a small transient spike before the p-channel threshold is reached, because the internal hot-bus voltage $V_B$ must surpass the threshold voltage for the p-channel transistors turn on. This current transient is short-lived since the hot bus quickly charges the relatively small internal capacitances. Thus the hot bus is not disturbed.

Figure 10:
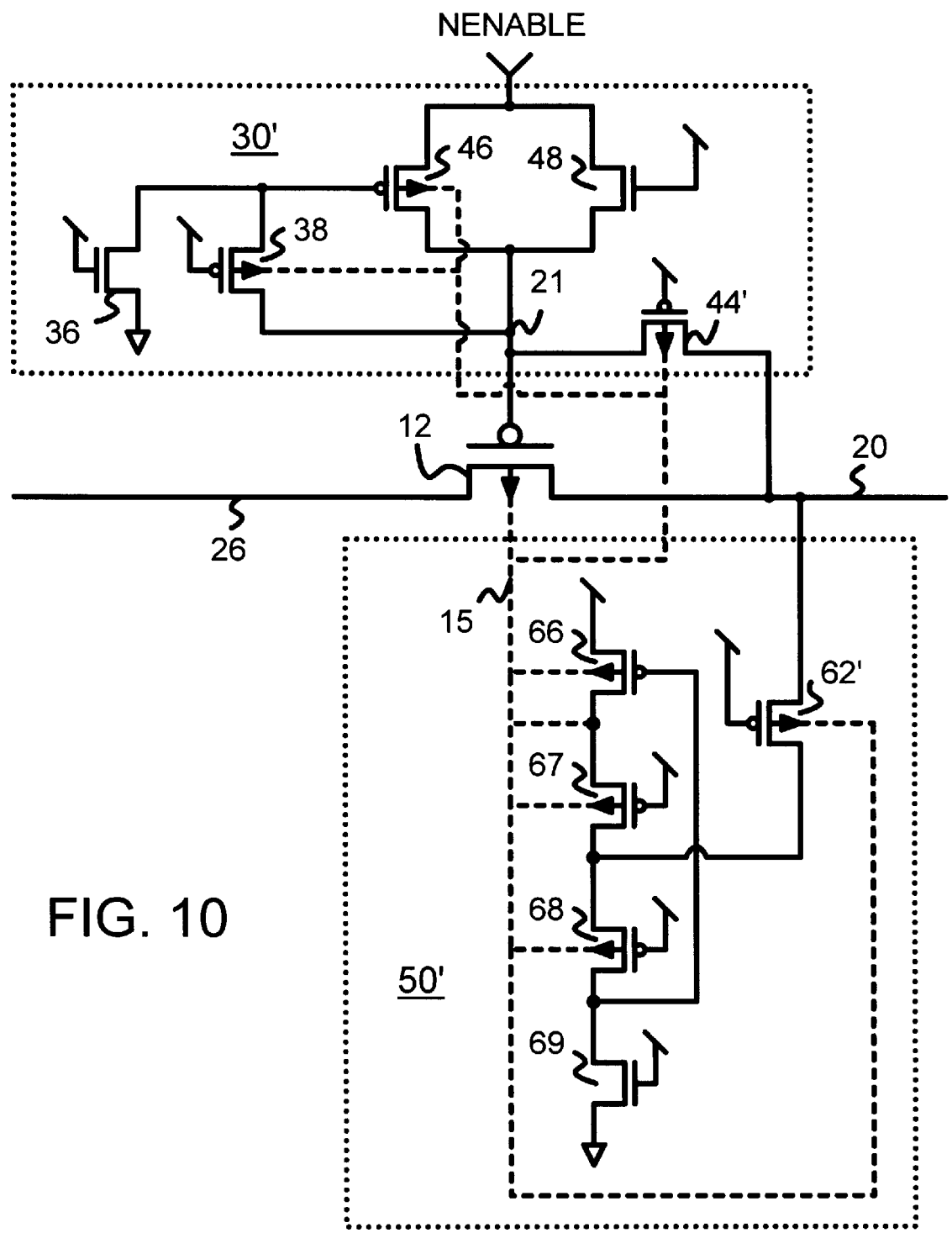
FIG. 10 is a diagram of an alternate embodiment that only senses on side of the bus switch.

Single-Sided Embodiment—FIG. 10

FIG. 10 is a diagram of an alternate embodiment that only senses one side of the bus switch. If it is assumed that the hot bus is always on one side of the bus switch and that the second bus is always powered down during live insertion, the circuit can be simplified.

Since the second bus is usually powered down in most live-insertion applications, it can be assumed that the second bus is at zero volts. The second bus does not connect to either the gate node or the N-well node in that case. Thus transistors that connect the second bus to the gate node or to the N-well node can be deleted from FIGS. 7, 8.

For gate isolation circuit 30', transistors 46, 48, 36, 38 operate in the same manner as before to isolate the enable signal NENABLE during power down. A single p-channel transistor 44' connects hot bus 20 to gate node 21 during power down. When power is restored, transistor 44' turns off, isolating the hot bus from gate node 21.

Substrate isolation circuit 50' has transistors 66, 67, 68, 69 that operate in the same manner as described for FIG. 8. A single p-channel transistor 62' is used for bus isolation. Transistor 62' connects hot bus 20 to N-well node 15 through well isolation transistor 67 when power is off. Transistor 62' turns off, isolating hot bus 20, when power is restored since its gate is connected to $V_{DD}$.

ADVANTAGES OF THE INVENTION

The isolation circuit operates without power from the power supply. This remarkable quality allows the isolation circuit to operate even before power has been turned on. High impedance is maintained in the bus switch even during hot insertion. The hot bus is not disturbed by insertion. Minimal current is drawn from the hot bus to charge the p-channel gate and the N-well.

Since the invention keeps a p-channel transistor in the high-impedance state even without a power supply, a bus switch can have the complementary p-channel transistor and still be used for live insertion. The p-channel transistor dramatically improves the drive characteristics of the bus switch for low-voltage applications. On-resistance remains relatively constant for all bus voltages. Higher voltages can be passed through the bus switch without voltage degradation.

The isolation circuitry does not interfere with the operation of the bus switch when power is applied during normal operation. The transistors in the isolation circuit can be kept small since there are no speed requirements. The area overhead is thus small.

When the hot bus is actively transferring data, it pulses to high and low voltages. During the time the voltage on the hot bus is high, the gate node and the N-well are charged up. As the hot bus pulses low, the isolation circuits shut off, keeping the charge on the gate node and the N-well. Thus the hot bus can continue to pulse high and low during live insertion.

ALTERNATE EMBODIMENTS

Several other embodiments are contemplated by the inventor. The invention is also useful for live removal, where a card is powered down and pulled out of the system. The invention has been described for live insertion of network cards, but other live insertion applications such as computer cards can benefit from the invention. Although only one bit of busses and the bus switch have been shown, many applications use a multi-bit-wide bus. The bus switch and its isolation circuit are simply replicated for each bit of the bus, although common enable signals can be used.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A complementary metal-oxide-semiconductor (CMOS) bus switch for live insertion into a hot bus when the bus switch is powered down, the bus switch comprising:

an n-channel bus-switch transistor coupled to conduct current between the hot bus and a second bus in response to an enable signal applied to a gate of the n-channel bus-switch transistor;

a p-channel bus-switch transistor coupled to conduct current between the hot bus and the second bus in response to a gate node connected to a gate of the p-channel bus-switch transistor; and a gate-isolation circuit for driving the gate node with an inverse signal, the inverse signal being a logical inverse of the enable signal, a low voltage on the inverse signal for enabling the p-channel bus-switch transistor to conduct current, the gate-isolation circuit connecting the hot bus to the gate node when the bus switch is powered down;

wherein a high voltage on the hot bus disables the p-channel bus-switch transistor from conducting current when the bus switch is powered down, whereby the p-channel bus-switch transistor is disabled from conducting when the bus switch is powered down but the high voltage is on the hot bus.

2. The CMOS bus switch of claim 1 further comprising:

an internal power supply for the bus switch;

a substrate-isolation circuit, coupled to the hot bus, for connecting the internal power supply to a substrate under the p-channel bus-switch transistor when the bus switch is powered, but for disconnecting the internal power supply from the substrate and for connecting the high voltage on the hot bus to the substrate when the bus switch is powered down, whereby the substrate under the p-channel bus-switch transistor is isolated from the internal power supply and connected to the hot bus when the bus switch is powered down.

3. The CMOS bus switch of claim 2 wherein the p-channel bus-switch transistor has a junction diode from a p+ drain connected to the hot bus to the substrate, the substrate-isolation circuit preventing the junction diode from being forward-biased when the bus switch is powered down but the hot bus is at a higher voltage.

4. The CMOS bus switch of claim 2 wherein the substrate is an N-well separated from the internal power supply by the substrate-isolation circuit, the N-well isolated and separated from other N-wells that are directly connected to the internal power supply by a p-type substrate.

5. The CMOS bus switch of claim 2 wherein the gate isolation circuit comprises:

a transmission gate for disconnecting the inverse signal from the gate node when the bus switch is powered down, the transmission gate including an n-channel transistor having a gate connected to the internal power supply, the n-channel transistor conducting current when the internal power supply is powered up but not conducting current when the internal power supply is powered off;

a connecting transistor for conducting current between the hot bus and the gate node when the internal power supply is powered off, the connecting transistor being a p-channel transistor with a gate connected to the internal power supply.

6. The CMOS bus switch of claim 5 wherein the transmission gate further comprises:

a p-channel transistor in parallel with the n-channel transistor in the transmission gate, the p-channel transistor having a gate driven to ground when the bus switch is powered up, but connected to the gate node when the bus switch is powered down.

7. The CMOS bus switch of claim 6 further comprising:

a p-channel coupling transistor coupled to conduct between the gate node and the gate of the p-channel transistor in the transmission gate, the p-channel coupling transistor having a gate connected to the internal power supply, whereby the p-channel coupling transistor conducts when the internal power supply is powered down but isolates when the internal power supply is powered up.

8. The CMOS bus switch of claim 2 wherein the substrate-isolation circuit comprises:
   a p-channel bus-isolation transistor having a gate connected to the internal power supply, for conducting current from the hot bus to the substrate when the internal power supply is powered down;
   a p-channel supply transistor coupled to connect the internal power supply to the substrate when power is applied, the supply transistor having a supply gate;
   an n-channel pull-down transistor having a gate connected to the internal power supply, for pulling the supply gate to ground when powered up;
   a p-channel disabling transistor having a gate connected to the internal power supply, for connecting the hot bus to the supply gate when powered down.

9. The CMOS bus switch of claim 8 wherein all p-channel transistors in the substrate-isolation circuit and in the gate-isolation circuit are in one or more isolated N-wells electrically connected together as the substrate driven by the substrate-isolation circuit.

10. The CMOS bus switch of claim 8 wherein the substrate-isolation circuit further comprises:
   a p-channel sensing transistor having a gate connected to the second bus, connected in series with the p-channel bus-isolation transistor, for conducting current from the hot bus to the substrate in response to the second bus being powered down.

11. The CMOS bus switch of claim 5 wherein the gate-isolation circuit further comprises:
   a second p-channel connecting transistor having a gate connected to the second bus, connected in series with the connecting transistor, for conducting current from the hot bus to the gate node in response to the second bus being powered down.

12. An asymmetric bus switch for live insertion comprising:
   a hot bus for transferring data by pulsing high and low;
   a second bus;
   an n-channel bus-switch transistor coupled to connect the hot bus to the second bus in response to an enable signal;
   a p-channel bus-switch transistor coupled to connect the hot bus to the second bus in response to a gate node, the gate node driven by an inverse signal of the enable signal when the bus switch is powered up;
   a gate-isolation circuit comprising:
      a p-channel connecting transistor having a gate connected to power, for connecting the hot bus to the gate node when power is off;
      a core-isolation n-channel transistor having a gate connected to power, for connecting the inverse signal to the gate node when powered;
      a core-isolation p-channel transistor having a gate connected to a control node, for connecting the inverse signal to the gate node when powered;
      a pull-down n-channel transistor having a gate connected to power, for pulling the control node low when powered to enable the core-isolation p-channel transistor;
      a pull-up p-channel transistor having a gate connected to power, for connecting the control node to the gate node when not powered to disable the core-isolation p-channel transistor
   a well-isolation circuit comprising:
      a tap to an N-well that the p-channel bus-switch transistor is formed in;
      a bus isolation p-channel transistor having a gate connected to power and a source connected to the hot bus and a drain connected to a second node;
      a well-isolation p-channel transistor having a gate connected to power, for conducting between the second node and the tap to the N-well;
      a supply p-channel transistor having a supply gate and a source connected to power, for connecting power to the tap to the N-well when powered;
      a disable p-channel transistor having a gate connected to power, for connecting the second node to the supply gate when not powered; and
      a disable pull-down n-channel transistor having a gate connected to power, for pulling the supply gate low when powered,
   whereby the hot bus is connected to the gate node and to the N-well when the bus switch is not powered.

13. The asymmetric bus switch of claim 12 wherein all p-channel transistors in the gate-isolation circuit and all p-channel transistors in the well-isolation circuit are electrically connected to the tap to the N-well driven by the well-isolation circuit and not directly connected to power.

14. A bus switch for live insertion comprising:
   a hot bus actively transferring data by pulsing high and low;
   a second bus;
   an n-channel bus-switch transistor coupled to connect the hot bus to the second bus in response to an enable signal;
   a p-channel bus-switch transistor coupled to connect the hot bus to the second bus in response to a gate node, the gate node driven by an inverse signal of the enable signal when the bus switch is powered up;
   a gate-isolation circuit comprising:
      a first pair of p-channel connecting transistors connected together in series between the hot bus and the gate node, with one gate connected to power and another gate connected to the second bus, for connecting the hot bus to the gate node when power is off and the second bus is low;
      a core-isolation n-channel transistor having a gate connected to power, for connecting the inverse signal to the gate node when powered;
      a core-isolation p-channel transistor having a gate connected to a control node, for connecting the inverse signal to the gate node when powered;
      a pull-down n-channel transistor having a gate connected to power, for pulling the control node low when powered to enable the core-isolation p-channel transistor;
      a pull-up p-channel transistor having a gate connected to power, for connecting the control node to the gate node when not powered to disable the core-isolation p-channel transistor
   a well-isolation circuit comprising:
      a tap to an N-well that the p-channel bus-switch transistor is formed in;
      a bus isolation p-channel transistor having a gate connected to power and a source connected to the hot bus and a first drain;
      a sensing p-channel transistor having a gate connected to the second bus, for conducting from the first drain to a second node;

a well-isolation p-channel transistor having a gate connected to power, for conducting between the second node and the tap to the N-well;

a supply p-channel transistor having a supply gate and a source connected to power, for connecting power to the tap to the N-well when powered;

a disable p-channel transistor having a gate connected to power, for connecting the second node to the supply gate when not powered; and a disable pull-down n-channel transistor having a gate connected to power, for pulling the supply gate low when powered, whereby the hot bus is connected to the gate node and to the N-well when the bus switch is not powered.

15. The bus switch of claim 14 wherein the well-isolation circuit further comprises:

a second bus isolation p-channel transistor having a gate connected to power and a source connected to the second bus and a third drain;

a second sensing p-channel transistor having a gate connected to the hot bus, for conducting from the third drain to a fourth node;

a second well-isolation p-channel transistor having a gate connected to power, for conducting between the fourth node and the tap to the N-well;

a second supply p-channel transistor having a second supply gate and a source connected to power, for connecting power to the tap to the N-well when powered;

a second disable p-channel transistor having a gate connected to power, for connecting the fourth node to the second supply gate when not powered; and a second disable pull-down n-channel transistor having a gate connected to power, for pulling the second supply gate low when powered, wherein the bus switch can be live-inserted into either the hot bus or the second bus.

16. The bus switch of claim 15 wherein the gate-isolation circuit further comprises:

a second pair of p-channel connecting transistors connected together in series between the second bus and the gate node, with one gate connected to power and another gate connected to the hot bus, for connecting the second bus to the gate node when power is off and the hot bus is low, whereby a high voltage on either the second bus or the hot bus is connected to the gate node when powered off.

17. The bus switch of claim 16 wherein all p-channel transistors in the gate-isolation circuit and all p-channel transistors in the well-isolation circuit are electrically connected to the tap to the N-well driven by the well-isolation circuit and not directly connected to power.

18. The bus switch of claim 14 wherein the second bus is an internal bus on a network-interface card that is powered down during live insertion into the hot bus.

19. The bus switch of claim 18 wherein the bus switch is on the network-interface card.

\* \* \* \* \*